(12) United States Patent
Desplats et al.

(10) Patent No.: US 9,123,652 B2
(45) Date of Patent: Sep. 1, 2015

(54) MULTI-LEVEL AUTOLIMITATING ETCHING METHOD

(71) Applicants: COMMISSARIAT A L'ENERGIE ATOMIQUE ET AUX ENE ALT, Paris (FR); CNRS-Centre National de la Recherche Scientifique, Paris (FR)

(72) Inventors: Olivier Desplats, Grenoble (FR); Thierry Chevolleau, Grenoble (FR); Maxime Darnon, Gieres (FR); Cecile Gourgon, Cessieu (FR)

(73) Assignees: COMMISSARIAT A L'ENERGIE ATOMIQUE ET AUX ENERGIES ALTERNATIVES, Paris (FR); CNRS-Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 14/189,004

(22) Filed: Feb. 25, 2014

(65) Prior Publication Data

US 2014/0242801 A1 Aug. 28, 2014

(30) Foreign Application Priority Data

Feb. 25, 2013 (FR) ...................................... 13 51606

(51) Int. Cl.
- *H01L 21/3065* (2006.01)
- *H01L 21/762* (2006.01)
- *H01L 31/0224* (2006.01)
- *H01L 31/0236* (2006.01)

(Continued)

(52) U.S. Cl.
CPC ...... *H01L 21/3065* (2013.01); *H01L 21/30621* (2013.01); *H01L 21/76232* (2013.01); *H01L 31/02363* (2013.01); *H01L 31/02366* (2013.01); *H01L 31/022425* (2013.01); *H01L 31/182* (2013.01)

(58) Field of Classification Search
CPC ................. H01L 21/76232; H01L 31/022425; H01L 31/02363; H01L 31/02366; H01L 31/182; Y02E 10/546; Y02E 10/547
See application file for complete search history.

(56) References Cited

U.S. PATENT DOCUMENTS

| 4,778,583 | A | 10/1988 | Wagner et al. |
| 2010/0224251 | A1* | 9/2010 | Funakoshi ..................... 136/261 |
| 2012/0315716 | A1* | 12/2012 | Araki et al. ..................... 438/31 |

OTHER PUBLICATIONS

D.B. Graves, "Plasma Processing", IEEE Transaction on Plasma Science, vol. 22, year 1994, pp. 31-42.*

(Continued)

*Primary Examiner* — Lan Vinh
*Assistant Examiner* — Jiong-Ping Lu
(74) *Attorney, Agent, or Firm* — Oblon, McClelland, Maier & Neustadt, L.L.P.

(57) ABSTRACT

A method for producing patterns includes inclined flanks from a face of a substrate. A protective mask is formed covering at least two masked areas of the face of the substrate and defining at least one intermediate space. An inclined flank is plasma etched from each masked area, wherein the etching forms continuous passivation layer on the inclined flanks producing autolimitation of the etching when the inclined flanks join each other. The etching is carried out in a chamber and includes the introduction into the chamber of a gas additional to the plasma. The additional gas includes molecules of a chemical species participating in the formation of the passivation layer, the quantity of gas in the chamber being controlled so that the chamber contains a quantity of molecules of the species sufficient to form the passivation layer continuously.

17 Claims, 6 Drawing Sheets

(51) Int. Cl.
*H01L 31/18* (2006.01)
*H01L 21/306* (2006.01)

(56) References Cited

OTHER PUBLICATIONS

S. Winderbaum et al., "Reactive Ion Etching (RIE) as a Method for Texturing Polyscrystalline Silicon Solar Cells", Solar Energy Materials and Solar Cells, vol. 46, year 1997, pp. 239-248.*
H.F.W. Dekkers, "Study and optimization of dry process technologies for thin crystalline silicon solar cell manufacturing", Ph.D. Dissertation, KU Leuven, Belgium, year 2008.*
L. Escoubas et al., "Sand-Castle Biperiodic Pattern for Spectral and Angular Broadening of Antireflective Properties", Optics Letters, vol. 35, year 2010, pp. 1455-1457.*
French Preliminary Search Report issued Oct. 24, 2013 in French Application 13 51606, filed on Feb. 25, 2013 (with English Translation of Categories of Cited Documents and Written Opinion).
Sergi Gomez et al. "Etching of high aspect ratio structures in Si using $SF_6/O_2$ plasma", Journal of Vacuum Science and Technology. A, vol. 22, No. 3, 2004, 10 pages.
S. Winderbaum et al. "Reactive ion etching (RIE) as a method for texturing polycrystalline silicon solar cells", Solar Energy materials and Solar Cells, vol. 46, No. 3, 1997, 10 pages.
Ludovic Escoubas et al "Sand-castle biperiodic pattern for spectral and angular broadening of antireflective properties", Optics Letters, vol. 35, No. 9, 2010, 3 pages.
European Search Report issued Nov. 24, 2014 in Patent Application No. 14155317.2 (with English Translation of Category of Cited Documents).
Masaaki Sato, et al., "Control of etching-product-dependent shape and selectivity in gate polysilicon reactive ion etching", Journal of Vacuum Science & Technology B, vol. 16, No. 3, American Vacuum Society, XP 12006759, (May 1, 1998), pp. 1038-1042.
K. Kennedy, et al., "Fabrication of v-groove gratings in InP by inductively coupled plasma etching with 'SiCl4/ Ar", Semiconductor Science and Technology, vol. 21, No. 1, Institute of Physics Publishing, XP 001243890, (Nov. 28, 2005), pp. L1-L5.

* cited by examiner

Art Antérieur

MULTI-LEVEL AUTOLIMITATING ETCHING METHOD

TECHNICAL FIELD OF THE INVENTION

The present invention concerns in general the manufacture of microelectronic devices based on semiconductor materials and in particular optoelectronic devices produced by the microelectronic industry and particular the antireflective means used for improving the efficacy of optical to electrical conversion of these devices.

PRIOR ART

The optoelectronic devices produced by the microelectronic industry, in particular solar cells and optical detectors, whether they be designed to function in the infrared (IR) range or in the visible wavelength range, always use antireflective means so as to maximise the number of incident photons absorbed by the underlying semiconductor in order to convert light into electrical energy with the greatest possible efficiency.

One simple and inexpensive technique, and therefore one that is very widely used, consists of covering the surface of the device with one or more thin layers of antireflective transparent materials. The thicknesses and materials are chosen so as to cause destructive interferences of the reflected waves and on the other hand to favour the transmission of incident waves. Because of the very operating principle, based on the alternation of the refractive indices of the various layers, the effectiveness of this technique, referred to overall by the acronym ARC (antireflective coating), is however highly dependent on the wavelength range and also the angle of incidence of the light radiation that it is necessary to be able to detect. Moreover, the deposition of a layer of one or more foreign materials on the surface of the device generally poses problems of adhesion and stability of these layers in the long term, problems that may able aggravated by a different thermal behaviour of these vis-à-vis the body of the device.

Another approach that has been explored by the scientific community working in this field consists of creating reliefs on the surface of the optoelectronic device. These reliefs have dimensions suited to the wavelength range to be detected. In this approach, it is therefore arranged to create a structuring of the surface that prevents the incident radiation being able to be reflected, if not totally, at least to a very major extent. Such a system, and a review of known means, were for example described in an article published in English on 1 May 2010 in volume 35, number 9, of Optics Letters, a publication of the Optical Society of America, under the title "Sand-castle bipe-riodic pattern for spectral and angular broadening of antireflective properties" by R Bouffaron et al.

This article shows that a very effective antireflective structure, that is to say one that functions in a wide range of wavelengths and angles of incidence of the radiation to be detected, can be obtained by the repetition of patterns in a relief with a pyramidal shape with a square base and double periodicity, which is referred to as a sand castle because of the presence of two levels of pyramids over the height. A three-dimensional representation of the antireflective structure 100 formed by these patterns in relief 110 is reproduced in FIG. 1a. FIG. 1b is a transverse section 101 of the latter, where two levels 120 and 130 of superimposed pyramidal patterns can be seen. In order to obtain the expected efficacy of this double pyramidal structure, first it is necessary for the slope 112 of the two levels to be controlled without a break in continuity between these. Second, the efficacy of the structure depends highly on the absence of a flat surface at the bottom of the patterns. In order to obtain optimum antireflection it is necessary for the bottom 114 of the patterns 110 to clearly form a V.

This surface structuring 100 therefore consists of a network of patterns in relief 110 covering the surface of the device and therefore the unit element is a sand castle on two levels as in the example of FIGS. 1a and 1b. In a particular example embodiment, the large base 111 of the sand castle, which is also the period of the network, has a dimension of 1 micron or μm, that is to say $10^{-6}$ meters. The dimensions of the patterns are advantageously chosen so as to limit the reflection in a range of wavelengths of between 500 nm and 5 μm. The height 113 of the first level or lower level is 1.25 μm and the upper plateau or mesa 119 of this first level has a width of 500 manometers or nm, that is to say $10^{-9}$. The truncated pyramids of the second level or upper level have a dimensional ratio identical to those of the first level, and thus the base of a pyramid has a side of 250 nm, the height 115 thereof is 312.5 nm whereas the upper mesa 117 has a side of 125 nm.

Though the above publication does indeed give all the potential advantages of the use of the structure described in FIGS. 1a and 1b, it however says nothing about the way in which it is possible in practice to form this on the surface of an optoelectronic device of the type produced by the microelectronic industry. The publication in fact mentions only the fact that this structure could be obtained by the known technique of "nanoimprint", that is to say by printing patterns of nanometric sizes, which poses the problem of the manufacture of the nanoprint mould itself and implicitly assumes that the patterns are imprinted in a layer of the material that is actually sufficiently malleable to be imprintable with the drawbacks mentioned above of the prior deposition of a layer of a foreign material on the surface of the optoelectronic device.

An object of the invention is therefore to propose a method for overcoming all or some of the drawbacks of the prior art in order to improve the production of the patterns, in particular in slopes, on the surface of a material and, according to an advantageous non-limitative application, to describe a method for manufacturing the pyramidal structure illustrated in FIGS. 1a and 1b that can be implemented industrially in the context of a manufacturing line for optoelectronic devices.

Other objects, features and advantages of the present invention will appear from an examination of the following description and accompanying drawings. Naturally other advantages may be incorporated.

SUMMARY OF THE INVENTION

One aspect of embodiments of the invention relates to a method for producing patterns comprising inclined flanks from one face of a substrate, characterised in that is comprises:

formation of a protective mask covering at least two masked areas of the face of the substrate and defining at least one intermediate space;

etching with a plasma forming, on at least one intermediate space, at least one inclined flank from each masked area, the etching comprising the formation of a continuous passivation layer on the inclined flanks producing an autolimitation of the etching when the inclined flanks join each other.

By virtue of this aspect of the invention, patterns, even though sometimes complex, can be executed with a single etching operation. Furthermore, stopping the etching at the pattern bottom is automatic. The invention ingeniously takes advantage of the passivation produced during the etching and in fact an advantage for the whole of the manufacturing method.

According to the invention, the passivation is advantageously maintained by introducing into the etching chamber at least one species participating in the passivation reaction, which could fail without this addition so that the passivation would stop without it.

BRIEF DESCRIPTION OF THE FIGURES

The aims and objects as well as the features and advantages of the invention will emerge more clearly from the detailed description of an embodiment thereof that is illustrated by the following accompanying drawings, in which.

Figure 1A:
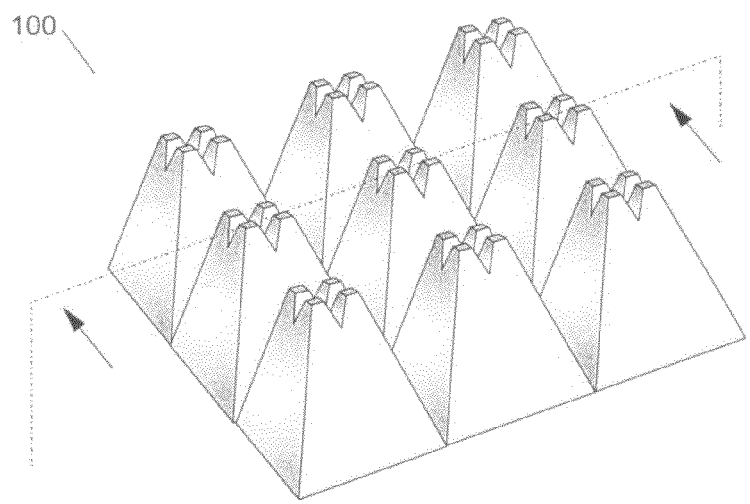
FIGS. 1a and 1b illustrate an antireflective structure made from patterns in relief that can be created with method of the invention on the surface of an optoelectronic device.

The accompanying drawings are given by way of examples and are not limitative of the invention.

DETAILED DESCRIPTION OF THE INVENTION

Before going into the detail of embodiments with reference to the figures, optional features that the invention may optionally present separately or in all combinations between them are stated below:

The etching is carried out in a chamber and comprises an introduction into the chamber of a gas additional to the plasma, said additional gas comprising molecules of a chemical species participating in the formation of the passivation layer, the quantity of gas in the chamber being controlled so that the chamber contains, throughout the etching, a quantity of molecules of the species sufficient to form the passivation layer continuously.

The quantity of additional gas is controlled so as to keep the growth of the passivation layer constant during the etching.

The formation of the passivation layer comprises a reaction of the chemical species of the additional gas with another chemical species of the plasma.

The other chemical species comprises oxygen.

The passivation layer comprises a chemical species of the substrate.

The etching is configured so as to generate molecules of the chemical species of the additional gas during the etching of the substrate.

The protective mask is chosen so as not to react to the etching.

It comprises a removal of the passivation layer and of the protective mask after etching.

The removal comprises an attack on the passivation layer and protective mask with an acid solution.

The masked areas are configured so as to produce a first series of inclined flanks having a first level of depth in the substrate and at least a second series of inclined flanks having a level of depth different from the first level.

It comprises two sets of four masked areas with a square cross section and arranged in corners of a square, the sets being spaced apart along a first direction of the face of the substrate with a first repetition step.

The sets are spaced apart in a second direction of the face of the substrate, perpendicular to the first direction, with a second repetition step.

The first and second repetition steps are equal.

The etched material of the substrate is silicon (Si).

The protective mask is made from silicon dioxide ($SiO_2$).

The plasma is based on dichloride and dioxygen ($Cl_2:O_2$).

The passivation layer is based on silicon.

The additional gas contains the chemical species silicon.

The additional gas is silicon tetrachloride ($SiCl_4$).

The invention relates to the manufacture of any device such as in particular those indicated previously. These manufactures involve substrates defined here as structures with at least one layer of material, highly advantageously of the semiconductor type, and forming a stack or a wafer of semiconductor material or materials. The substrate may form all or part of the final microelectronic device or be an intermediate element at least partially eliminated during manufacture, for example serving as a support handle for the production and/or transfer of functional layers. Face of the substrate means a part of the surface of the substrate exposed to the outside and typically one of the two faces delimiting the thickness of the substrate. This face is non-limitatively but advantageously planar before implementation of the invention.

The patterns obtained with reference to the drawings present only one advantageous example. Inclined flank means the fact that a pattern comprises a slope, here gradually formed in a hollow from the face of the substrate, producing a concave profile on the surface of the substrate. This profile is preferably rectilinear, the inclination advantageously being constant during the etching, which does not exclude variations that are desired or are inherent in the manufacturing tolerances.

The patterns are formed gradually by etching around masked areas. These areas are, in the illustrations, surface islands on the face of the substrate. These areas could have other configurations and in particular have at least in some cases at least contact or continuity areas. For example, four areas can be formed by four borders of a frame with a rectangular or circular cross section. In general terms, the masked areas are advantageously configured so as to define intermediate spaces at which flanks are etched, with a high point at the masked areas, so as to join each other at a low intersection point.

The method of the invention described below is arranged to produce the required structuring at at least two levels, such as the one described in FIGS. 1a and 1b, during an advantageously unique photolithography step, followed by a unique plasma etching operation.

Figure 2:
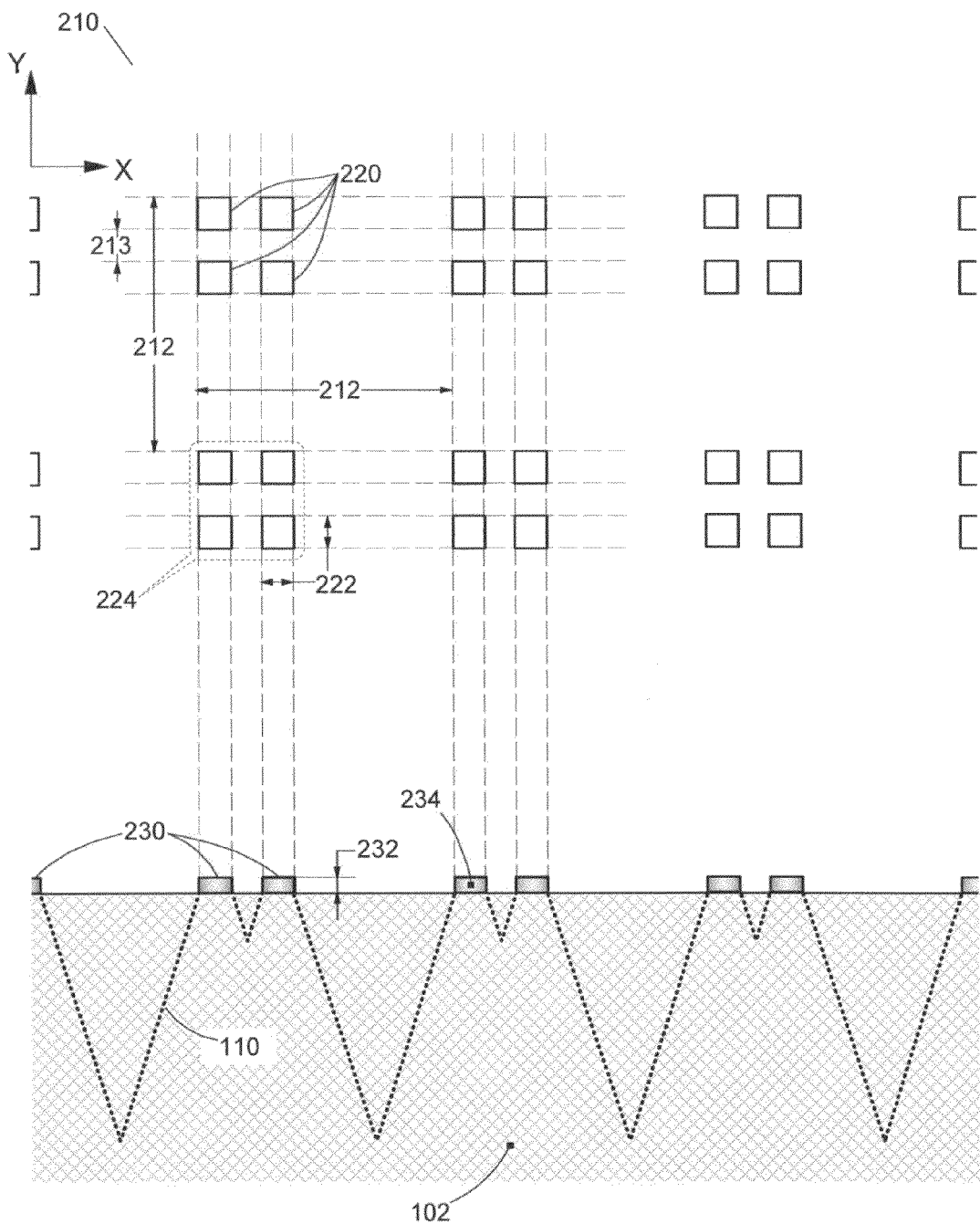
FIG. 2 shows an example of a unique mask that will serve to define the structure of the patterns in relief on two levels that will be obtained after etching.

FIG. 2 shows an example of a unique mask 210 that will serve to define the structure 100 of the patterns in relief 110 on two levels that would be obtained after etching.

The mask reproduces, by marked areas, the tops of the truncated pyramids of the top level 130 and their repetition step in the plane X-Y. the horizontal and vertical repetition step 212 is therefore in accordance with the width 111 of the of the base of the truncated pyramid of the lower level. The areas 220 of the mask for their part are similar to the tops of the truncated pyramids of the upper level 130. Their wide 222 is therefore defined by the width 117 of the tops of the pyramids of the upper level and they fit in the square 224 defined by the width 119 of the top of the pyramids of the lower level 120. The dimensions are for example those mentioned in the section on the prior art.

By using photolithography and etching techniques the patterns 220 of the mask are first of all transferred to the surface of the material to be etched in the form of a so-called hard mask (HM) 230. The purpose of the hard mask is to protect the areas that must not be etched. In general terms, it is therefore made from a material 234 and has a thickness 232 that will enable it to resist, for a sufficiently long time, the etching operation that follows. In the context of the invention, the material to be etched 102, in which the antireflective structure 100 will be reduced, is typically silicon (Si). The material 234 of the hard mask 230 may be silicon dioxide ($SiO_2$). It is preferably made from a material selected to be insensitive to the etching to be carried out thereafter.

Figure 1B:
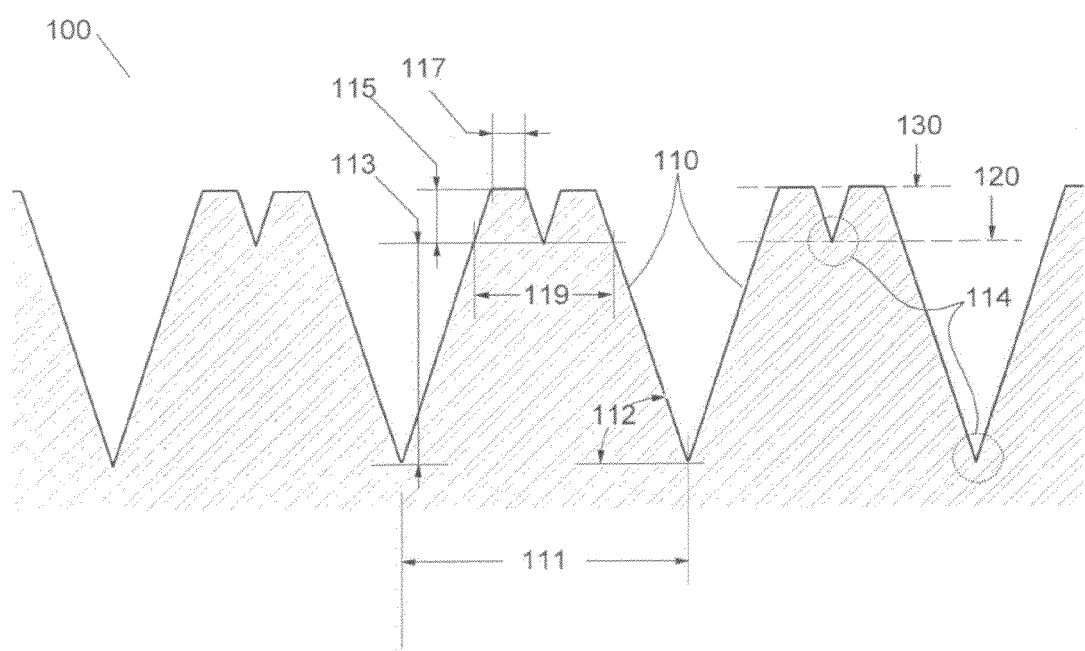

In order to produce the pyramidal pattern on two levels 110 described in FIGS. 1a and 1b, use is made of an etching of the plasma type. It is possible to use etching reactors in which an etching plasma is created. They may allow the formation of flanks on a slope of the patterns 110 by having recourse in particular to a plasma of the $Cl_2:O_2$ type, that is to say based on chlorine and oxygen. This is because chlorinated species make it possible to etch silicon while forming species of the Si—$Cl_x$ type. These are adsorbed by all the surfaces exposed to the plasma and in particular by the walls of the reactor and also by the flanks of the patterns, from which they can desorb in order to be re-etched by the chlorine of the plasma or be oxidised by the oxygen of the plasma. The reaction of these volatile Si—$Cl_x$ species with the oxygenated species of the plasma leads to the formation of complexes of halogenated silicon oxide of the Si—$O_x$—$Cl_y$ type that are not volatile. In addition, these Si—$O_x$—$Cl_y$ complexes do not react chemically with the species of the plasma and can no longer be reduced during etching. Thus the plasma etching method briefly described above little by little, during the etching, grows a passivation layer, which makes it possible to obtain etching on a slope that is able to form the flanks of the pyramids. The passivation is controlled by the quantity of Si—$Cl_x$ produced during the etching and by the density of oxygen of the plasma. The instantaneous slope at the foot of the pattern during etching is defined by the rate of growth of the passivation layer and by the speed of etching. The passivation forms, typically by oxidation, a layer of a material that is less corrodible than its support and in the present case it provides protection against the continuation of the etching at a passivated point on the intermediate spaces.

Figure 3:
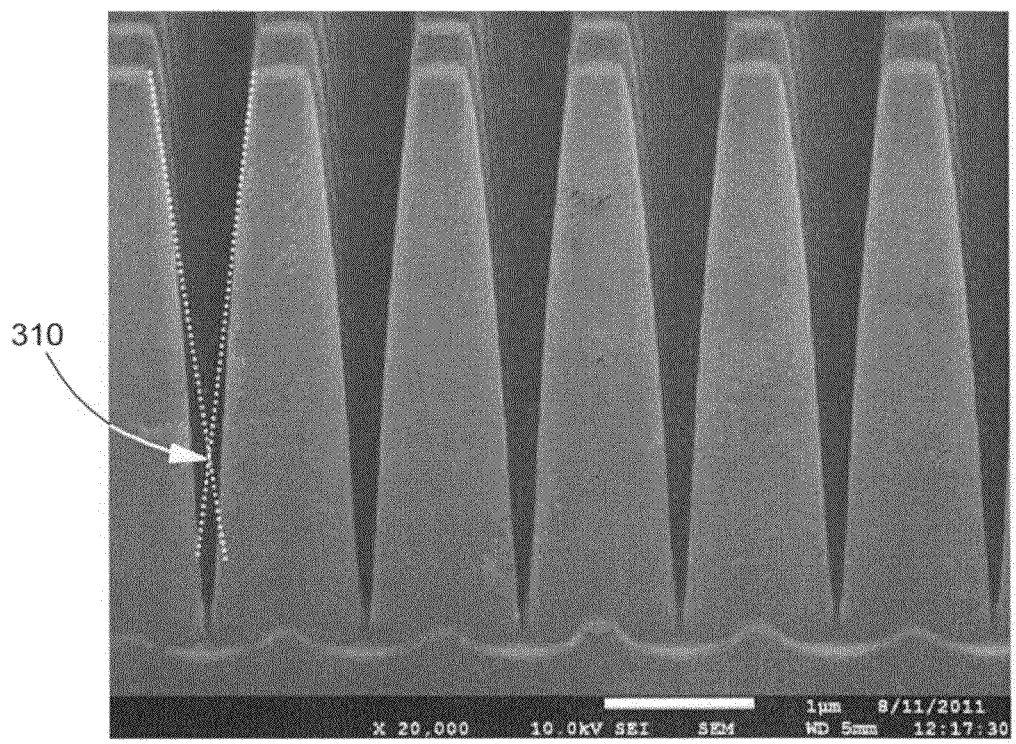
FIG. 3 shows the curved profile of the flanks of the pyramids and the non-autolimitation of an etching using a plasma of the $Cl_2:O_2$ type.

However, the sand castle with at least two levels 110 of the antireflective structure 100 can be obtained according to the invention by using at least a third gas in addition to the etching based on plasma of the $Cl_2:O_2$ type. This is because, under the conditions given in the previous paragraph, the quantity of Si—$Cl_x$ produced during the etching decreases as the depth reached increases since the formation of flanks on a slope reduces the surface area of silicon etched between the pyramids. Thus the angle of the slope of the flanks is not constant over the entire height of the pyramid. It tends to increase when the quantity of Si—$Cl_x$ decreases. The growth rate of the passivation layer decreasing, a curved profile is then formed. In addition the etching continues in this case between the pyramids without ever being blocked, leading the pyramid flanks to be almost vertical with very great depths. The curved profile of the flanks of the pyramids and the non-autolimitation of the etching are illustrated 310 by FIG. 3, which shows a photograph taken by scanning electron microscope (SEM) of pyramids produced in a $Cl_2:O_2$ plasma as described above.

The method of the invention affords a solution to this problem by adding a third gas to the $Cl_2:O_2$ or other gaseous mixture, necessary for the etching. The gas added is advantageously silicon tetrachloride ($SiCl_4$). It has in fact been remarked that the presence thereof made it possible to preserve a quantity of $SiCl_x$ species that was almost constant throughout the etching and to be free from the variation in the quantity of $SiCl_x$ that appeared in the case of a plasma with two gases $Cl_2:O_2$.

In general terms, it is possible to determine the quantity of the species participating in the reaction forming the passivation layer, during the etching. And the addition of additional gas is adjusted accordingly. The quantity of the species in question can thus preferentially be kept constant.

This solution provides the junction between two successive pyramids at a depth fixed by the lateral growth rate of the passivation layer. This is because the constant quantity of $SiCl_x$ in the plasma causes a constant growth rate of the passivation layer on the etching flanks and therefore makes it possible first to locally block the etching when the passivation layers of two adjacent pyramids join and second to form, as desirable, an etching bottom in a V. The etching continues all around on the non-passivated surfaces.

Thus the etching method of the invention is autolimiting. The etching stops automatically when the pyramids are created, that is to say as soon as the inclined flanks have joined in order to form a V-shaped etching bottom.

Highly advantageously, the autolimitation of the etching afforded by the method of the invention therefore makes it possible to produce several etching levels during the same operation. In combination with the design of a mask such as the one described in FIG. 2, it is then possible, during a single global photolithography and etching step, to obtain the antireflective structure 100 with two levels illustrated in FIGS. 1a and 1b of the section on the prior art.

The typical conditions of implementation of the method of the invention in an etching chamber in which a plasma supplied with the above gases is formed may be:
chamber pressure: 20 millitorr;
power of the source: 1000 watts;
biasing power: 150 watts;
chlorine ($Cl_2$) flow rate: 40 sccm (standard cubic centimeters per minute);
flow rate of silicon tetrachloride ($SiCl_4$): 40 sccm;
oxygen ($O_2$) flow rate: 25 sccm.

At the end of the etching operation, cleaning is carried out in order to remove the hard mask of silicon oxide and the passivation layers that have formed on the flanks during etching. This operation is preferably performed by chemical attack in an acid medium, typically using hydrofluoric acid (HF).

Figure 4:
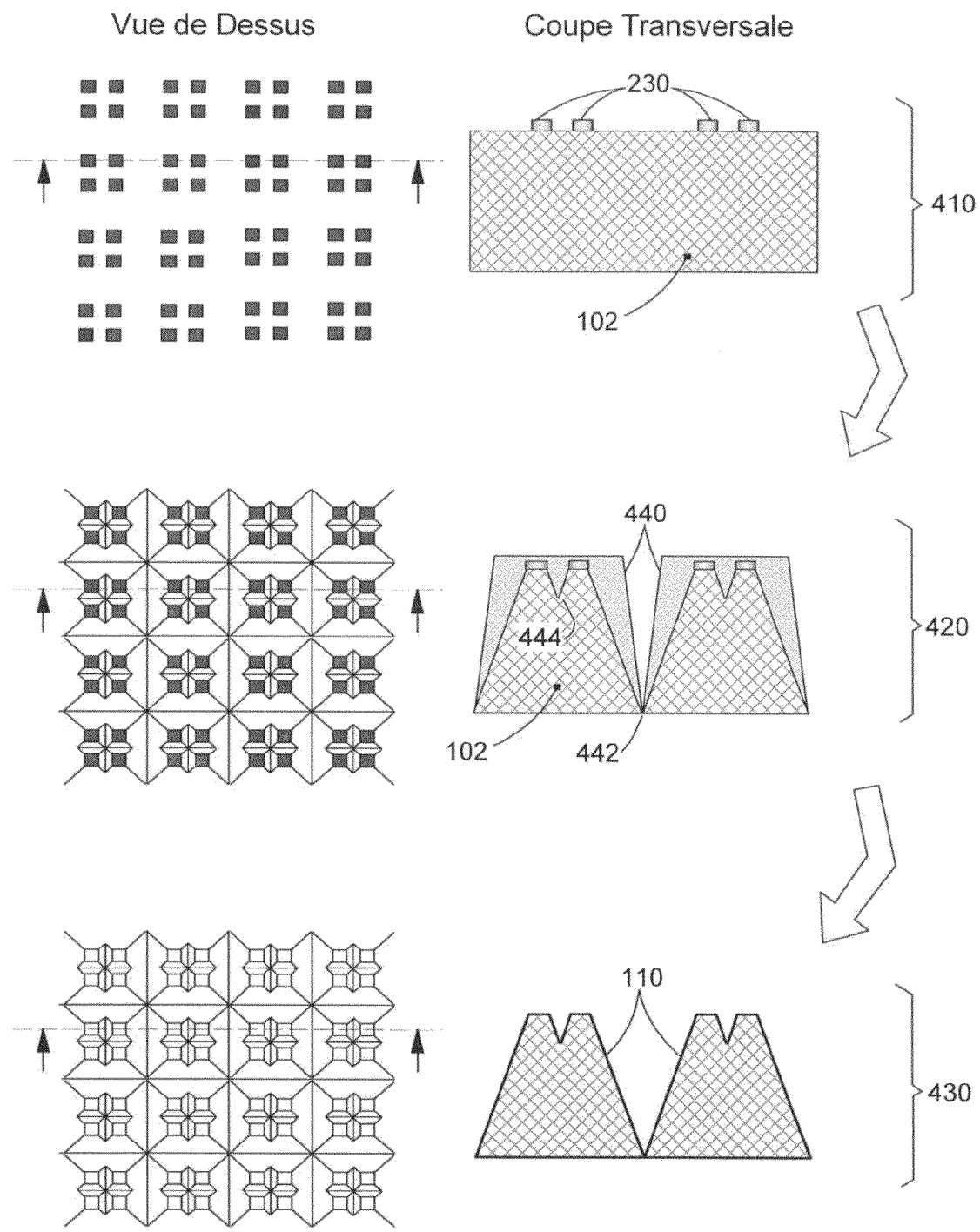
FIG. 4 summarises the steps of the method of the invention with three phases each seen from above on the left-hand part of the figure and in transverse section on the right-hand part of the figure.

FIG. 4 summarises the steps of an embodiment of the method of the invention.

During a first step 410, the hard mask 230 is formed on the surface of the material to be etched. The material to be etched is for example a substrate made from or based on silicon 102 or a surface layer made from or based on silicon of a substrate. The hard mask defines the areas 220 representing the top of the truncated pyramids of the upper level 130 as explained in FIG. 2. The hard mask is preferably obtained by photolithography and etching of a layer of a material previously deposited and able to protect the silicon during the plasma etching, which makes it possible to create the pyramidal patterns forming the surface structuring.

During the second step 420, the plasma etching of the patterns in relief 110 is carried out. As explained, under the conditions described for the implementation of the method of the invention, there is formation and continuous growth of a passivation layer 440 causing etching of the flanks in a slope, the etched surface reducing with the increase in the etched depth. The etching of the silicon 402 stops automatically when the flanks of the passivation layer join at the bottom of the patterns 442, thus completely protecting the underlying material. The same phenomenon 440 occurred first of all for the etching of the pyramids of the upper level. In this way, with the mask described in FIG. 2, two etching levels are indeed obtained.

During the third step the passivation layer 440 and the hard mask 230 are removed. This operation is performed by immersing the device, during manufacture on a substrate, generally a wafer of semiconductor material of the type used by the microelectronic industry, in an acidic wet environment, for example based on hydrofluoric acid (HF). In this way the patterns 110 in relief and the desired surface structuring are obtained.

Figure 5A:
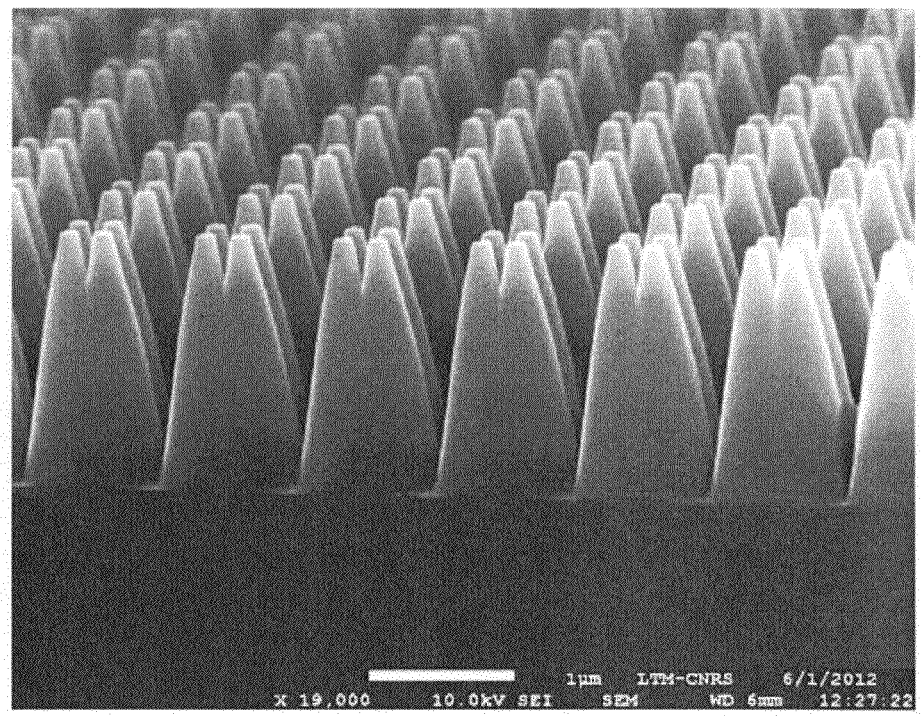
FIGS. 5a and 5b show pyramids with two levels obtained with the method of the invention.
Figure 5B:
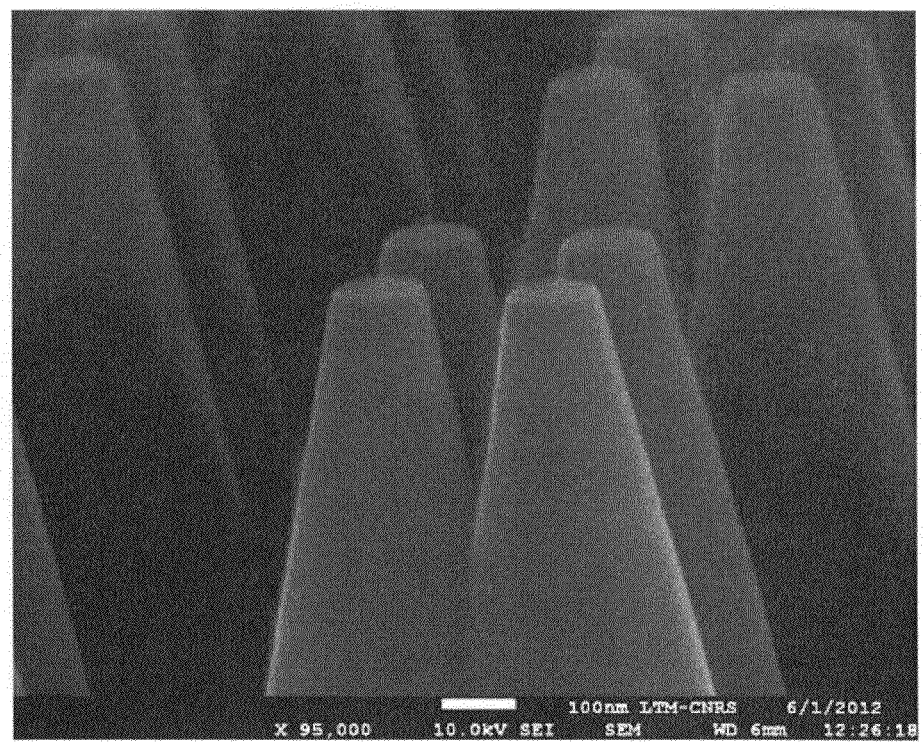

FIGS. 5a and 5b show photographs taken with a scanning electron microscope (SEM) of pyramids with two levels produced according to the method of the invention. Although a certain erosion of the edges of the pyramids due the plasma etching can be seen, in particular, as shown in FIG. 5b, on those of the upper level of smaller size, the method of the invention does indeed in practice make it possible to obtain the desired surface structuring 100. The pyramidal adjective means here a pattern having the overall form of a portion of a pyramid, which may include imprecisions in particular due to a defect inherent in the manufacture.

Figure 6:
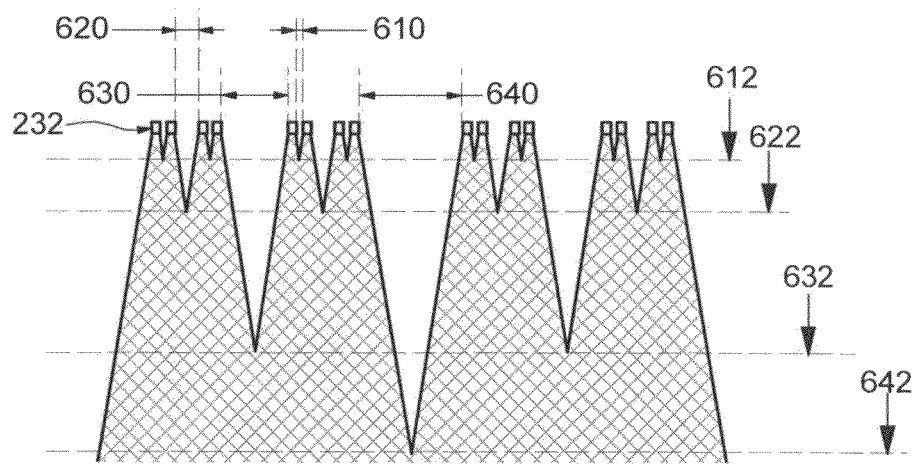
FIG. 6 illustrates the possibility offered by the method of the invention of producing a surface structuring on more than two levels.

FIG. 6 illustrates the fact that the method of the invention, in combination with the design of the corresponding photolithography mask, makes it possible to etch more than two levels. FIG. 6 shows the case where a hard mask 232 having in this example four different gaps between the patterns 610, 620, 630 and 640 is produced. Four different etching levels are then obtained: 612, 622, 632, and 642. In general there are as many etching levels created as there are different gaps between the patterns of the hard mask.

Apart from the silicon tetrachloride ($SiCl_4$) used up until then for describing the method of the invention and for experiments, all the following gases containing silicon are able to be used as passivating gas for implementing the invention, in addition to $Cl_2$:$O_2$ or another basic plasma:

| Type of gas: | Composition: |
| --- | --- |
| chlorinated | $SiCl_4$, $SiH_3Cl$ |
| brominated | $SiBr_4$, $SiH_3Br$ |
| fluorinated | $SiF_4$ |
| iodinated | $SiI_4$ |
| bromochlorinated | $SiBr_2Cl_2$, $SiCl_3Br$ |
| chlorofluorinated | $SiClF_3$ |

The invention can moreover be applied to the etching of materials by forming a passivation layer not containing silicon, using for example the following gases also applicable to silicon:

Fluorocarbonated gases: $CH_2F_2$, $CHF_3$, $C_4F_6$, $C_4F_8$, $CCl_4$ (may be formed in $Cl_2$ plasma with a resin mask), COS, $SO_2$ Combinations of gases: $CF_4$/$H_2$, $CF_4$/$NH_3$, $BCl_3$/$Cl_2$, For these gases, the $SiO_2$ is not necessarily the best suited and other materials may be preferred (resin, amorphous carbon, TiN, TaN, etc).

The method has been presented in the case of the etching of silicon. However, other materials can be etched using the same concept and the same passivating gases. For example, structures may be produced from InP using a $Cl_2$:$N_2$ plasma and adding $SiCl_4$ for the passivation.

In summary, a protocol to be followed for achieving a structuring on several levels of the surface of a material with the method of the invention may be as follows:

1—It is necessary first of all to determine the form and dimensions of the patterns in relief of the antireflective structure 100 that confer on it the required optical properties in the wavelength range in question. The invention does make any assumption on the way in which this result is obtained. The form and the dimensions are, for example, those indicated in FIG. 1b. These indicative forms and dimensions comprise:

$L_1$ the width 117 of the pattern 222 corresponding to the top of the upper pyramids
$L_2$ the width 119 of the foot of the upper pyramids
$P_{r1}$ the depth 115 of the upper pyramid
$P_{r2}$ the depth 113 of the lower pyramid
P the period 111 of the patterns
θ the angle of the slope.

Some of these dimensions are advantageously linked together. For example:

$$L_1 = (L_2 - (4 \times P_{R1}/\tan(\theta)))/2$$

$$P = L_2 + (2 \times P_{R2})/\tan(\theta)$$

$$\theta = \text{Arctangent}((2 \times P_{R2})/(P-L_2)) = \text{Arctangent}((2 \times P_{R1})/(L_2 - 2L_1))$$

The etching angle (θ) is necessarily the same for the two pyramids.

2—The corresponding mask can next be designed as in the example in FIG. 2. It is a case here of obtaining a network of areas formed by four squares that are repeated in the two dimensions of the plane (the perpendicular directions x and y). The dimensions to be defined for the mask are the width of the patterns 220 ($L_1$), the period 212 (P) and the space 213 between the patterns 220 (E). The dimensions $L_1$ and P are defined by the optical properties that it is necessary to confer on the antireflective structure or by the equations previously defined. The spacing E is defined by the equation $E = (2 \times P_{R1})/\tan(\theta) = L_2/2 - L_1$.

3—The layer of material constituting the hard mask 230 is deposited on the underlying material 102 in which the stack of truncated pyramids forming the antireflective structure will be formed as in the example in FIGS. 1a and 1b. The patterns of a photolithography mask defined as in the example of FIG. 2 are transferred into this layer, using the traditional photolithography and etching methods. The thickness 232 of the hard mask is chosen so that it is not entirely consumed during the etching of the patterns 110 and that any facets do not descend as far as the material to be etched during etching. In the example chosen to illustrate the invention, 100 nm of silicon oxide ($SiO_2$), the material constituting the hard mask, is deposited on a substrate made from silicon 102. The selectivity of the plasma etching of the $Cl_2$:$SiCl_4$:$O_2$ type between the silicon and its oxide being excellent, the minimum thickness of the hard mask necessary for etching several micrometers of silicon is less than the 100 nm used in this example.

4—The patterns defined at point 2 above may for example be formed in the hard mask using electron lithography defining in advance the patterns in a resin sensitive to electrons.

They are then transferred into the hard mask by plasma etching before proceeding with the removal of the resin.

5—The etching method of the invention uses a passivating gas, for example silicon tetrachloride (SiCl$_4$), for manufacturing the pyramids. By acting on the conditions of the method, the slope 112 is adapted to correspond to the dimension defined at point 1 above. The angle θ of the etching slope can be calculated according to the required values of spacing and depth of the patterns in accordance with the formulae given previously: θ=Arctangent((2× P$_{R2}$)/(P−L$_2$))=Arctangent((2×P$_{R1}$)/(L$_2$/−2 L$_1$))

It should be noted once again that the etching angle θ is the same for the two levels of pyramids. The conditions of the etching plasma are for example those that were indicated previously after the description of FIG. 3.

6—The etching method of the invention is suitable for enabling a complete transfer of the patterns of the hard mask into the material intended to constitute the pyramids. The etching time is chosen so as to be greater than the time necessary for the etching of a depth of material equal to the sum of the depths, 113 and 115, of the pyramids. For example, for the pyramids with the dimensions of FIG. 1*b*, it is necessary to be able to etch 1.575 μm of silicon. For an etching speed that is typically 550 nm/minute it is therefore necessary to provide an etching time greater than 172 seconds. Which is not a drawback since, as has been seen, there is autolimitation of the etching when the depth defined by the spacing between patterns is reached.

7—After etching, cleaning is carried out in order to remove the passivation layer that formed during the etching and the remaining hard mask. This can be done in one or more steps, by dry or wet method. For example, with a hard mask made from silicon oxide (SiO$_2$) with a thickness of 100 nm and with an SiCl$_4$:O$_2$:Cl$_2$ plasma etching method, a 49% dilute hydrofluoric acid (HF) bath for 30 seconds at ambient temperature can be used.

The invention claimed is:

1. A method for producing patterns comprising inclined flanks from a face of a substrate, comprising
    formation of a protective mask covering at least two masked areas of the face of the substrate and defining at least one intermediate space;
    etching with a plasma forming, on at least one intermediate space, at least one inclined flank from each masked area, wherein the etching comprising the formation of a continuous passivation layer on the inclined flanks producing autolimitation of the etching when the inclined flanks join each other, and wherein the etching is carried out in a chamber and comprises the introduction into the chamber of a gas additional to the plasma, said additional gas comprising molecules of a chemical species participating in the formation of the passivation layer, the quantity of gas in the chamber being controlled so that the chamber contains, throughout the etching, a quantity of molecules of the species sufficient to form the passivation layer continuously, wherein
    the passivation layer comprises a chemical species of the substrate, and
    the etching is configured so as to generate molecules of the chemical species of the additional gas during the etching of the substrate.

2. The method according to claim 1, wherein the quantity of additional gas is controlled so as to keep the growth of the passivation layer constant during the etching.

3. The method according to claim 1, wherein the formation of the passivation layer comprises a reaction of the chemical species of the additional gas with another chemical species of the plasma.

4. The method according to claim 3, wherein the other chemical species comprises oxygen.

5. The method according to claim 1, wherein the protective mask is chosen so as not to react to the etching.

6. The method according to claim 1, comprising a removal of the passivation layer and of the protective mask after etching.

7. The method according to claim 6, wherein the removal comprises an attack of the passivation layer and of the protective mask with an acid solution.

8. The method according to claim 1, wherein the masked areas are configured so as to produce a first series of inclined flanks having a first depth level in the substrate and at least a second series of inclined flanks having a depth level different from the first level.

9. The method according to claim 8, comprising sets of four masked areas with a square cross section and arranged at the corners of a square, the sets being spaced apart in first direction (x) of the face of the substrate with a first repetition step.

10. The method according to claim 9, wherein the sets are spaced apart in a second direction (y) of the face of the substrate, perpendicular to the first direction (x), with a second repetition step.

11. The method according to claim 10, wherein the first and second repetition steps are equal.

12. The method according to claim 1, wherein the etched material of the substrate is silicon (Si).

13. The method according to claim 1, wherein the protective mask is made from silicon dioxide (SiO$_2$).

14. The method according to claim 1, wherein the plasma is based on dichlorine and dioxygen (Cl$_2$:O$_2$).

15. The method according to claim 1, wherein the passivation layer is based on silicon.

16. The method according to claim 1, wherein the additional gas contains the chemical species silicon.

17. The method according to claim 16, wherein the additional gas is silicon tetrachloride (SiCl$_4$).

* * * * *